(12) United States Patent
Nakanishi et al.

(10) Patent No.: US 10,375,869 B2
(45) Date of Patent: Aug. 6, 2019

(54) CUT-AND-CLINCH APPARATUS AND BOARD WORK MACHINE

(71) Applicant: FUJI CORPORATION, Chiryu (JP)

(72) Inventors: Yusuke Nakanishi, Chiryu (JP); Haruaki Maeda, Seto (JP)

(73) Assignee: FUJI CORPORATION, Chiryu (JP)

( * ) Notice: Subject to any disclaimer, the term of this patent is extended or adjusted under 35 U.S.C. 154(b) by 97 days.

(21) Appl. No.: 15/129,355

(22) PCT Filed: Mar. 28, 2014

(86) PCT No.: PCT/JP2014/059161
§ 371 (c)(1),
(2) Date: Sep. 26, 2016

(87) PCT Pub. No.: WO2015/145730
PCT Pub. Date: Oct. 1, 2015

(65) Prior Publication Data
US 2017/0118879 A1    Apr. 27, 2017

(51) Int. Cl.
*H05K 13/04* (2006.01)
*H05K 13/00* (2006.01)
(Continued)

(52) U.S. Cl.
CPC ..... *H05K 13/0473* (2013.01); *H05K 13/0015* (2013.01); *H05K 13/0061* (2013.01);
(Continued)

(58) Field of Classification Search
CPC ............. Y10T 29/5143; Y10T 29/5145; Y10T 29/5147; Y10T 29/5148; Y10T 29/515;
(Continued)

(56) References Cited

U.S. PATENT DOCUMENTS 3,414,024 A * 12/1968 Anderson .......... H05K 13/0473
140/1
3,435,857 A * 4/1969 Welch ................ H05K 13/0473
140/71 R
(Continued)

FOREIGN PATENT DOCUMENTS

EP    2 894 012 A1    7/2015
JP    5-63396          3/1993
(Continued)

OTHER PUBLICATIONS

International Search Report dated Jun. 10, 2014, in PCT/JP2014/059161 filed Mar. 28, 2014.
(Continued)

*Primary Examiner* — Daniel Howell
*Assistant Examiner* — Yasir Diab
(74) *Attorney, Agent, or Firm* — Oblon, McClelland, Maier & Neustadt, L.L.P.

(57) ABSTRACT

A cut-and-clinch apparatus that cuts and bends protruding parts of two lead wires of a lead component to be respectively inserted through two of a plurality of through-holes formed in a circuit board, the cut-and-clinch apparatus includes a pair of movable elements that are used in a case where the respective protruding parts of the two lead wires are cut and bent and that are made to approach each other and separate from each other, and a movable element position control section that controls the positions of the pair of movable elements, on the basis of image data obtained by the pair of movable elements being imaged.

6 Claims, 13 Drawing Sheets

(51) Int. Cl.
  *H01L 21/48* (2006.01)
  *H01R 43/048* (2006.01)
(52) U.S. Cl.
  CPC ........ *H01L 21/4842* (2013.01); *H01R 43/048* (2013.01); *Y10T 29/515* (2015.01); *Y10T 29/5145* (2015.01); *Y10T 29/5149* (2015.01)
(58) Field of Classification Search
  CPC ............ H05K 13/0473; H01L 21/4842; H01R 43/04; H01R 43/048
  See application file for complete search history.

(56) References Cited

U.S. PATENT DOCUMENTS

| | | | | | |
|---|---|---|---|---|---|
| 3,986,533 | A | * | 10/1976 | Woodman, Jr. | H05K 13/0473 140/105 |
| 4,218,817 | A | * | 8/1980 | Takano | H05K 13/0473 29/715 |
| 4,312,109 | A | * | 1/1982 | Kawana | H05K 13/0452 29/564.6 |
| 4,447,945 | A | * | 5/1984 | Priscsak | H05K 13/0473 140/105 |
| 4,584,758 | A | * | 4/1986 | Jackson | H05K 13/0473 140/105 |
| 4,586,237 | A | * | 5/1986 | Bandura | H05K 13/0473 140/105 |
| 4,586,544 | A | * | 5/1986 | Yagi | B23D 31/00 140/105 |
| 4,622,740 | A | * | 11/1986 | Mirley, Jr. | H05K 13/08 29/705 |
| 4,630,354 | A | * | 12/1986 | Staviski | H05K 13/0473 140/105 |
| 5,044,062 | A | | 9/1991 | Maskens et al. | |
| 5,396,711 | A | | 3/1995 | Iwasaki et al. | |
| 5,867,893 | A | * | 2/1999 | Clark | H05K 13/0473 140/105 |
| 6,609,295 | B1 | * | 8/2003 | Koyama | H05K 13/0473 29/566.3 |

FOREIGN PATENT DOCUMENTS

| | | |
|---|---|---|
| JP | 5-209703 A | 8/1993 |
| JP | 6-95599 B2 | 11/1994 |
| WO | WO 2014/037993 A1 | 3/2014 |

OTHER PUBLICATIONS

Extended European Search Report dated May 3, 2017 in Patent Application No. 14886876.3.
European Office Action dated Sep. 11, 2018 for European Patent Application No. 14 886 876.3—1203.

* cited by examiner

CUT-AND-CLINCH APPARATUS AND BOARD WORK MACHINE

TECHNICAL FIELD

The present application relates to a board work machine including a pair of movable elements capable of approach each other and separating from each other.

BACKGROUND ART

A tooth thickness measuring device that measures the tooth thickness of a gear using a pair of measuring tips provided to be capable of approaching each other and separating from each other is described in PTL 1. In the present tooth thickness measuring device, the pair of measuring tips are made to linearly approach each other and separate from each other by one driving source.

CITATION LIST

Patent Literature

PTL 1: JP-A-05-209703

The purpose of the disclosure is to improve a board work machine including a pair of movable elements that are made to approach each other and separate from each other, for example, improve the positional accuracy of the pair of movable elements.

In the board work machine related to the disclosure, the positions of the pair of movable elements capable of approaching each other and separating from each other are controlled on the basis of image data obtained by imaging.

If based on the image data obtained by the pair of movable elements being actually imaging, actual positions of the pair of movable elements can be accurately acquired. The deviation amounts of the actual positions of the pair of movable elements from target positions (which means positions in a case where it is assumed that there are no errors, in other words, positions in a case where it is assumed that the movable elements are moved according to control instruction values, for example) can be accurately acquired. As a result, the actual positions of the pair of movable elements can be brought close to the target positions, and the positional accuracy of the pair of movable elements can be improved.

The pair of movable elements, for example, can be used for devices that perform cutting and clinching of lead wires to be inserted into a circuit board, can be used as members having lead wire insertion holes into which lead wires are to be inserted, can be used as members having cutting edges that cut lead wires, can be used as members having bending parts that bend lead wires, or the like.

BRIEF DESCRIPTION OF DRAWINGS

FIG. 11A: Pitch deviation amount, FIG. 11B: Axis deviation angle, FIG. 11C: Central point deviation amount

FIG. 14A: a case of $0<\theta<90°$, FIG. 14B: a case of $\theta=0$

DESCRIPTION OF EMBODIMENTS

Figure 1:
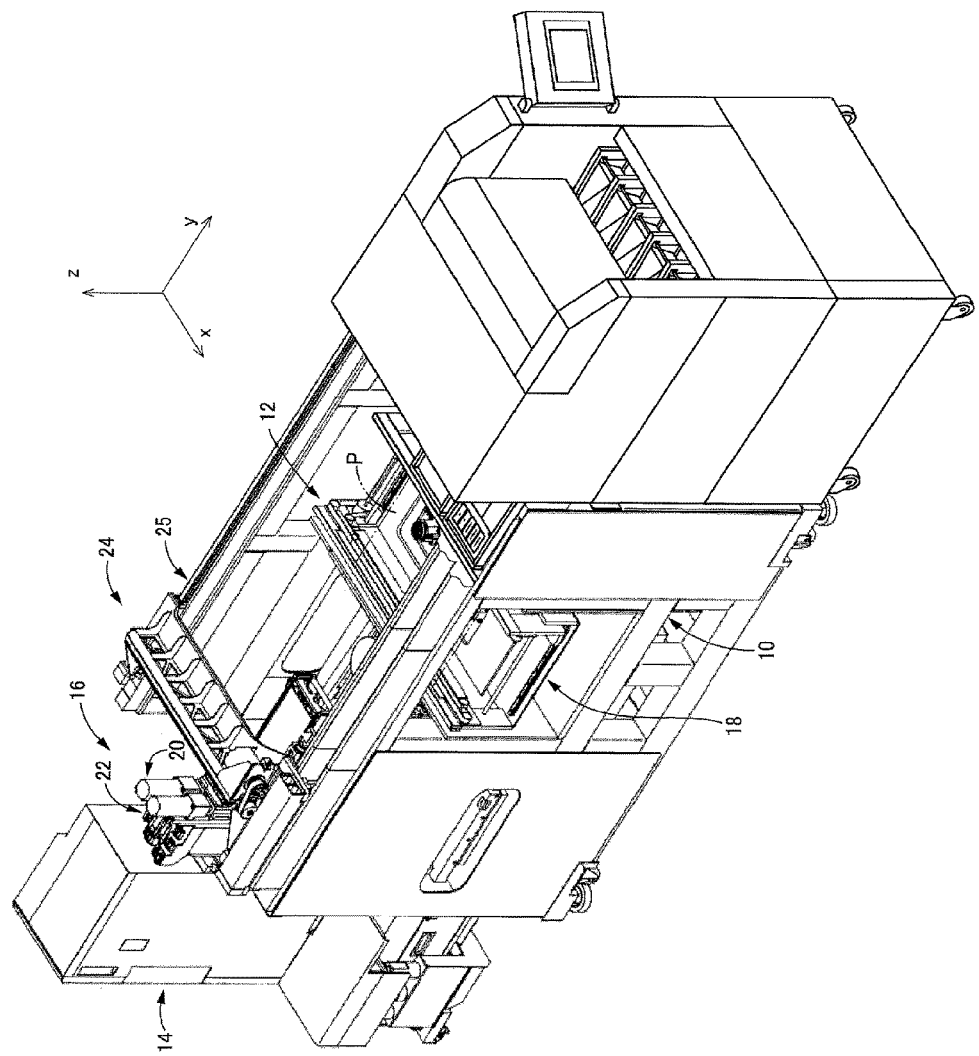
FIG. 1 is a perspective view illustrating a lead component mounting machine including a cut-and-clinch apparatus that is an embodiment of the disclosure. This cut-and-clinch apparatus is an example of the board work machine that is the embodiment of the disclosure.

Hereinafter, an embodiment of the disclosure will be described, referring to the drawings. In addition, the disclosure can be implemented in various forms in which various changes and improvements are made on the basis of the knowledge of a person's skilled in the art, in addition to the following embodiment.

As illustrated in FIG. 1, a lead component mounting machine that is a type of an automated assembly apparatus (electronic circuit assembly apparatus) includes (a) an assembly apparatus main body 10, (b) a board conveyance device 12, (c) a component supply device 14, (d) a component insertion device 16, and (e) a cut-and-clinch apparatus 18, and the like.

The board conveyance device 12 conveys and holds a circuit board P (hereinafter called a board P for short) in a horizontal posture. In FIG. 1, x represents a conveyance direction of the board P by the board conveyance device 12, y represents a width direction of the board P, and z represents a thickness direction of the board P, that is, an upward-downward direction of the lead component mounting machine. The x-direction, the y direction, and the z direction are orthogonal to each other.

The component supply device 14 supplies components to be mounted on the board P, and can be, for example, a component supply device including a plurality of tape feeders or including a plurality of trays. In the present embodiment, lead components that are components including lead wires are supplied.

Figure 2:
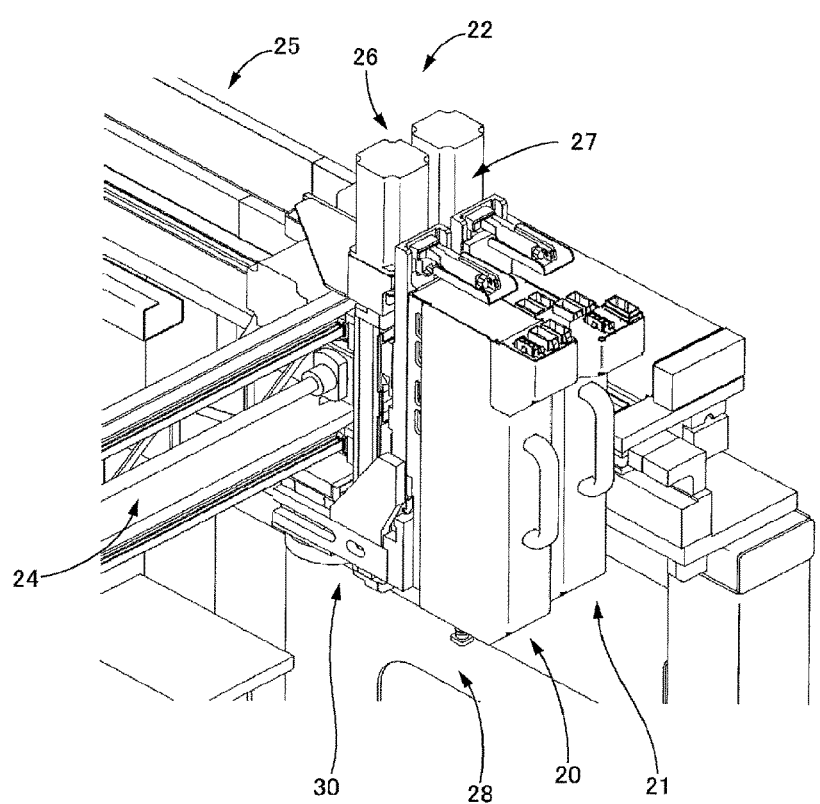
FIG. 2 is a perspective view illustrating a component insertion device included in the above lead component mounting machine.

The component insertion device 16 receives lead components supplied from the component supply device 14, and inserts these components into through-holes provided at predetermined positions on the board P held by the board conveyance device 12. The component insertion device 16 is provided above the board conveyance device 12, and as illustrated in FIG. 2, includes two work heads 20 and 21 and a work head moving device 22. The work head moving device 22 includes an x-direction moving device 24, a y-direction moving device 25, and z-direction moving devices 26 and 27. The work heads 20 and 21 can be integrally moved to the arbitrary positions within a horizontal plane by the x-direction moving device 24 and the y-direction moving device 25, and can be separately and independently moved in the z direction by the z-direction moving devices 26 and 27, respectively. One work head 20 of the two work heads includes a component holding tool 28 (for example, can be a chuck, a suction nozzle, or the like) that holds lead components. A camera 30 is provided in order to image a reference position mark (fiducial mark) on the board P, and is provided so as to be movable integrally with the work head 20. In the present embodiment, the camera 30 is fixedly attached to a z slider to which the work head 20 is detachably attached.

The cut-and-clinch apparatus 18 is provided below the board conveyance device 12, and is a device that cuts a portion, which protrudes from below the board P in a lead wire of a lead component inserted from above into a through-hole formed in the board P, with a predetermined length, and bending the portion along a back surface of the board P, thereby clinching the lead component to the board P. The cut-and-clinch apparatus 18, as illustrated in FIGS. 3 to 6, includes a cut-and-clinch unit 34, and a unit moving device 36 that moves (including linear movement and rotation) the cut-and-clinch unit 34.

The cut-and-clinch unit 34 includes (a) a unit main body 38, (b) a pair of first movable sections 40a and 40b that is held by the unit main body 38 so as to be linearly movable in a horizontal direction, (c) a pair of second movable sections 42a and 42b that is held by the first movable sections 40a and 40b, respectively, so as to be relatively movable in the horizontal direction, (d) a pitch changing device 44 that is provided in the unit main body 38 and causes the pair of first movable sections 40a and 40b to approach each other and separate from each other, thereby changing the spacing (pitch) between the first movable sections 40a and 40b, and the like.

The pitch changing device 44 includes (1) one pitch changing motor 46 (hereinafter called a P motor for short) that is a driving source, (2) a motion conversion mechanism 47 that converts the rotation of the P motor 46 into linear movement to linearly move the pair of first movable sections 40a and 40b, (3) a first guide rail 48 that is provided to extend in a direction horizontal to the unit main body 38, and the like. The motion conversion mechanism 47 includes (i) a male screw member 52 coaxially including a right-hand screw part 50 and a left-hand screw part 51, and (ii) a pair of nuts 53a and 53b that is threadedly engaged with the right-hand screw part 50 and the left-hand screw part 51, respectively. First movable section main bodies 54a and 54b that have engaging sections engaged with the first guide rail 48 are integrally movably held by the nuts 53a and 53b. The operation of the pitch changing motor 46 causes the pair of first movable sections 40a and 40b to approach each other and separate from each other, and changes the pitch between the pair of first movable sections 40a and 40b.

Figure 6:
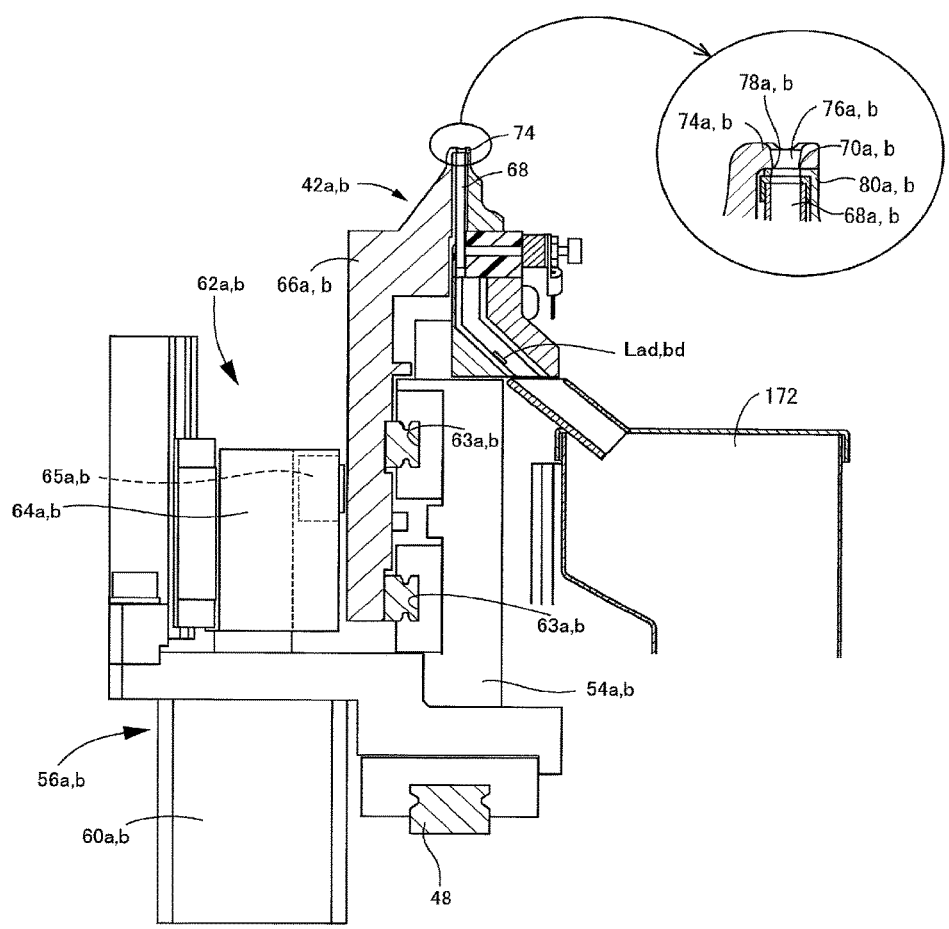
FIG. 6 is a partial sectional view of a cut-and-clinch unit included in the above cut-and-clinch apparatus.

As illustrated in FIG. 6, the pair of second movable sections 42a and 42b is respectively held by the pair of first movable section main bodies 54a and 54b via second movable section moving devices 56a and 56b so as to be individually relatively movable in the horizontal direction. The second movable section moving devices 56a and 56b include (a) air cylinders 60a and 60b serving as second movable section driving sources that are fixedly provided in the first movable section main bodies 54a and 54b, respectively, (b) motion conversion mechanisms 62a and 62b that converts the movement of output shafts of the air cylinders 60a and 60b in the z direction into movement in the horizontal direction to move the second movable sections 42a and 42b in the horizontal direction, (c) second guide grooves 63a and 63b that are respectively provided in the first movable section main bodies 54a and 54b so as to extend in the horizontal direction, and the like. The motion conversion mechanisms 62a and 62b include a cam mechanism, include cams 64a and 64b that are provided in the first movable section main bodies 54a and 54 and have inclined cam grooves formed therein, and rollers 65a and 65b serving as cam followers that are respectively engaged with the cam grooves 64a and 64b, and second movable section main bodies 66a and 66b having engaging sections engaged with the second guide grooves 63a and 63b are integrally movably held the rollers 65a and 65b. In the present embodiment, the cams 64a and 64b are lifted and forward with lifting and lowering of the output shafts by the operation of the air cylinders 60a and 60b, and the second movable sections 42a and 42b are caused to approach each other and separate from each other.

The first movable sections 40a and 40b have lead wire insertion holes 68a and 68b that extend in the vertical direction. The lead wire insertion holes 68a and 68b have openings in upper end surfaces of the first movable sections 40a and 40b, and opening edges thereof are used as stationary blades 70a and 70b. In contrast, upper end parts of the second movable sections 42a and 42b constitute a substantially L-shape, and have upwardly extending portions and approximately perpendicularly bent portions. Blade-forming sections 74a and 74b that are perpendicularly bent portions are located above upper end surfaces of the first movable sections 40a and 40b, and lead wire guide holes 76a and 76b that penetrate in the upward-downward direction are formed in portions that face openings of the lead wire insertion holes 68a and 68b. Lower end opening edges of the blade-forming sections 74a and 74b, the lead wire guide holes 76a and 76b are used as movable blades 78a and 78b.

In the present embodiment, the first movable sections 40a and 40b correspond to a pair of movers. However it is also possible to consider that the portions of the first movable sections 40a and 40b that include the openings of the lead wire insertion hole 68a and 68b correspond to movable elements 80a and 80b. Additionally, since the first movable sections 40a and 40b and the second movable sections 42a and 42b are made to be integrally movable in the horizontal direction by the pitch changing device 44, it is also possible to consider that movable elements are constituted of the first movable sections 40a and 40b and the second movable sections 42a and 42b (particularly portions that include upper end opening edges of the blade-forming sections 74a and 74b of the lead wire guide holes 76a and 76b).

The unit moving device 36 includes an x-direction moving device 86 that moves the cut-and-clinch unit 34 in the x-direction, a y-direction moving device 87 that moves the cut-and-clinch unit 34 in the y direction, the z-direction moving device 88 that moves the cut-and-clinch unit 34 in the z direction, a θ-rotation device 89 that rotates the cut-and-clinch unit 34 around a plumb line, and the like.

Figure 3:
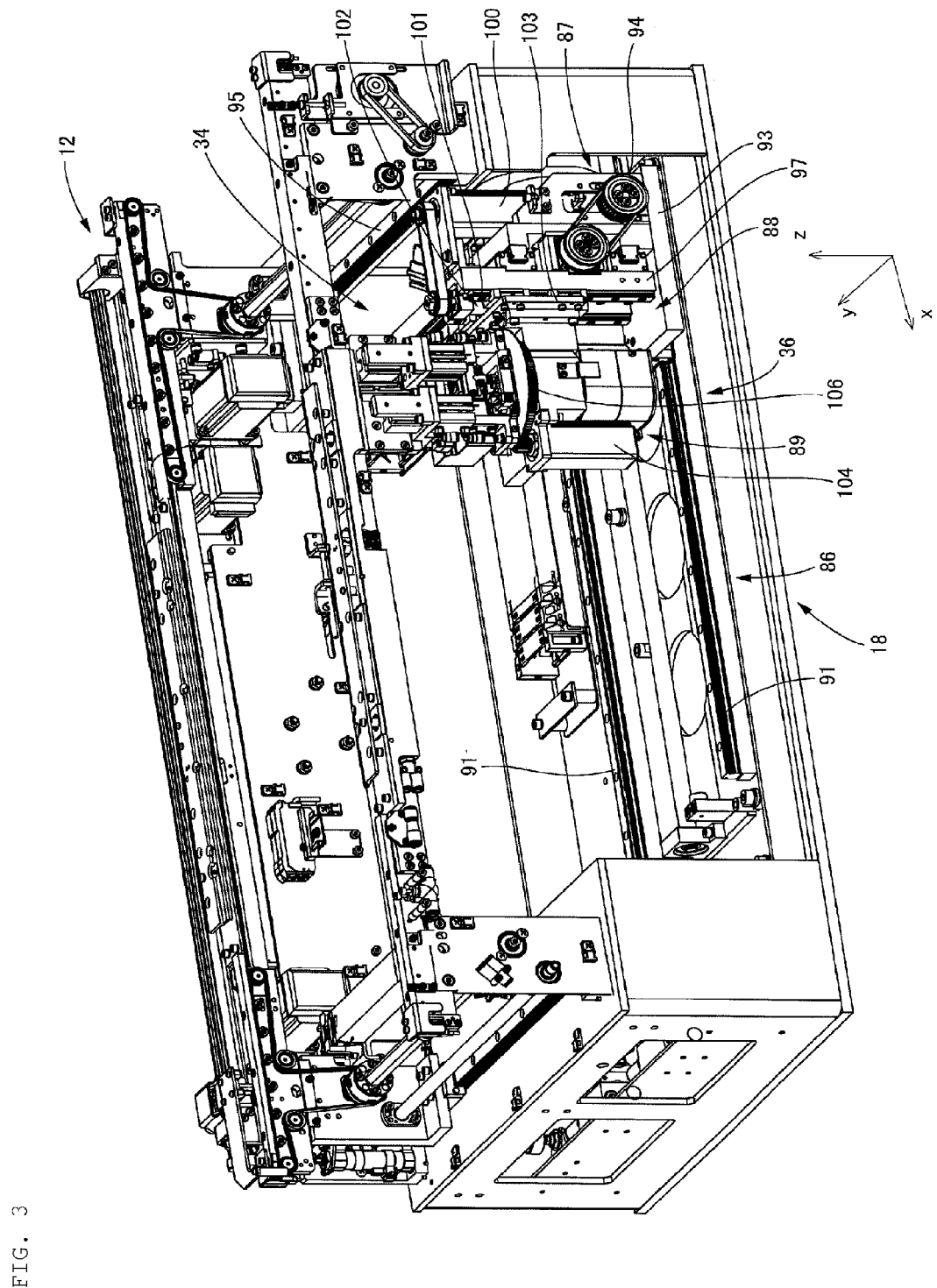
FIG. 3 is a perspective view of a board conveyance device included in the above cut-and-clinch apparatus and the above lead component mounting machine.
Figure 4:
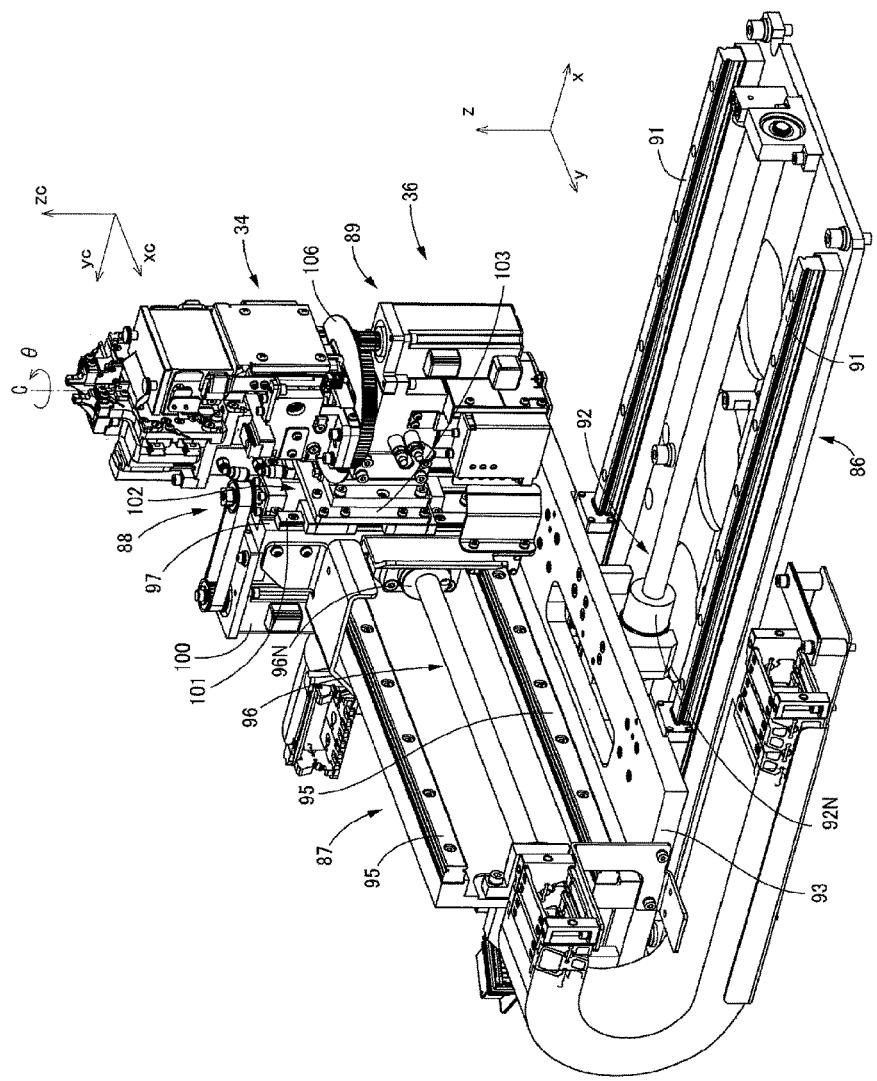
FIG. 4 is a perspective view of the above cut-and-clinch apparatus.
Figure 5:
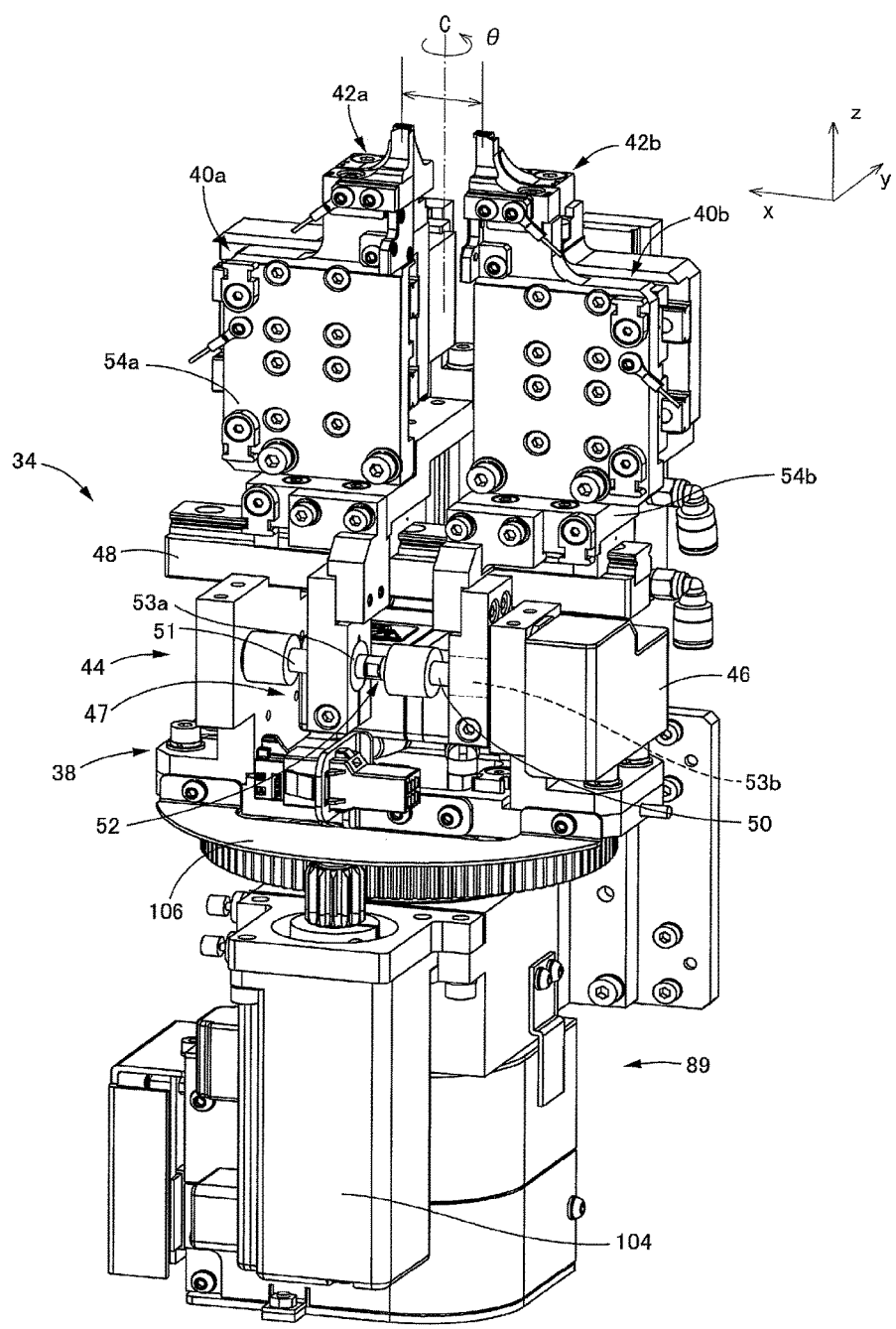
FIG. 5 is a perspective view illustrating main parts of the above cut-and-clinch apparatus.
Figure 7:
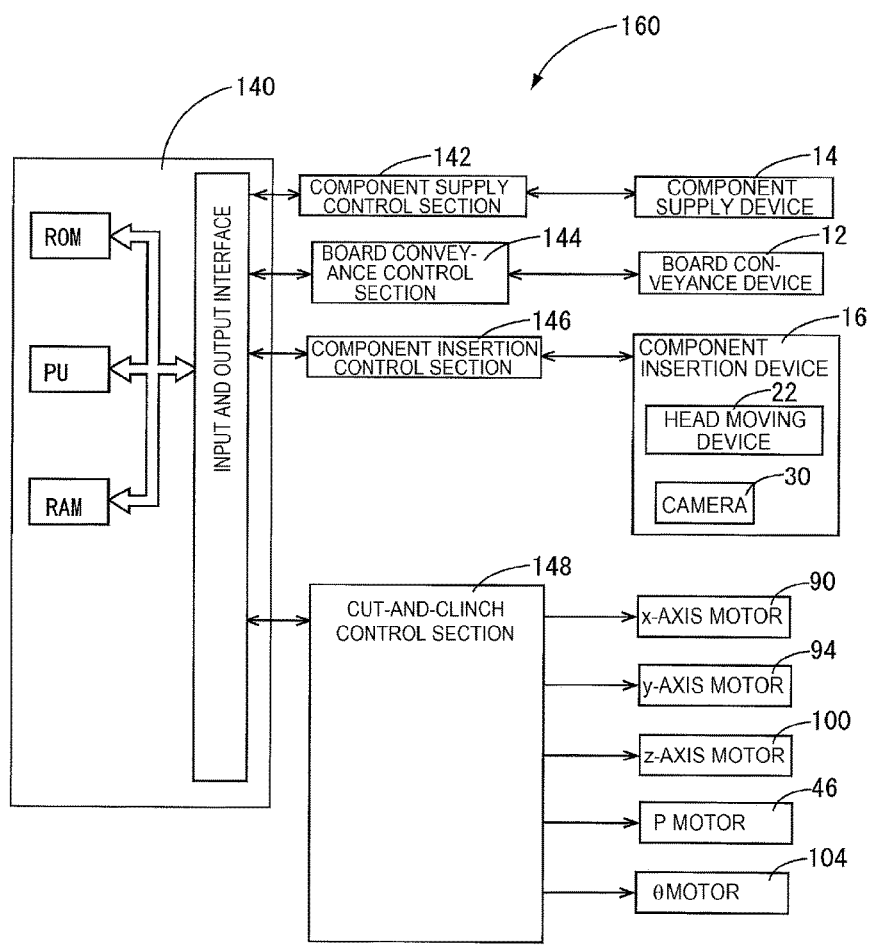
FIG. 7 is a block diagram conceptually illustrating a control device of the above lead component mounting machine.

As illustrated in FIGS. 3 and 4, the x-direction moving device 86 includes (1) an x-axis motor 90 (refer to FIG. 7), (2) an x-axis guide 91 that extends in the x-axis direction, (3) a ball screw mechanism 92 that converts the rotation of the x-axis motor 90 into linear movement, (4) an x slider 93 that is held by a nut 92N of the ball screw mechanisms 92 and is engaged with both the x-axis guide 91, and the like.

The y-direction moving device 87 is provided in the x slider 93, and includes (1) a y-axis motor 94, (2) a y-axis guide 95 that extends in the y-direction, (3) a ball screw mechanism 96, (4) a y slider 97 that is held by a nut 96N of the ball screw mechanisms 96 and is engaged with the y-axis guide 95, and the like.

The z-direction moving device 88 is provided in the y slider 97, and includes (1) a z-axis motor 100, (2) a guide 101 that extends in the z direction, (3) a ball screw mechanisms 102, (4) a z slider 103 that is held by a nut of the ball screw mechanisms 102 and is engaged with the guide 101, and the like. The z slider 103 also has a function as a unit support member that supports the cut-and-clinch unit 34.

The θ-rotation device 89 is provided in the z slider (unit support member) 103, include (1) a driving motor 104 that rotates the cut-and-clinch unit 34 around a plumb line, and (2) a rotary table 106 that is rotated around the plumb line with the rotation of (hereinafter called the θ motor 104 for short) of the θ motor 104, and the unit main body 38 is integrally rotatably provided in the rotary table 106.

In the present embodiment, in a case where θ is 0, a coordinate system (xc, yc, and zc) of the cut-and-clinch unit 34 and a coordinate system (x, y, and z) of the lead component mounting machine coincide with each other. However, by rotating the cut-and-clinch unit 34 around the plumb line using the θ-rotation device 89, the coordinate system (xc, yc, and zc) is rotated with respect to the coordinate system (x, y, and z) around the z-axis. Hereinafter, in a case where the coordinate system of the cut-and-clinch unit 34 is represented, this coordinate system is distinguished from the coordinate system of the lead component mounting machine by attaching suffix c.

Additionally, in the coordinate system of the cut-and-clinch unit 34, a movement direction (approach and separation direction) of the first movable sections 40a and 40b are an xc direction, and the movable elements 80a and 80b are located on an xc axis.

The overall lead component mounting machine is controlled by a main control device 140 having a computer as a main constituent. A component supply control section 142, a board conveyance control section 144, a component insertion control section 146, a cut-and-clinch control section 148, and the like that have a computer as a main constituent are connected to the main control device 140 so as to be communicable with each other. The control sections 142, 144, 146, and 148 control the above mentioned component supply device 14, board conveyance device 12, component insertion device 16, and cut-and-clinch apparatus 18, respectively. Additionally, the P motor 46, the x-axis motor 90, the y-axis motor 94, the z-axis motor 100, the θ motor 104, and the like are connects to the cut-and-clinch control section 148 via a drive circuit (not illustrated).

In addition, in the lead component mounting machine, it is not indispensable that the control sections are provided for respective devices, such as the component supply device 14, and the configuration of the control device is not limited to that in the present embodiment, like all the devices can be controlled on the basis of a command of the main control device 140.

Operation of Cut-and-Clinch Apparatus

{Cut-and-Clinch Operation}

Figure 8A:
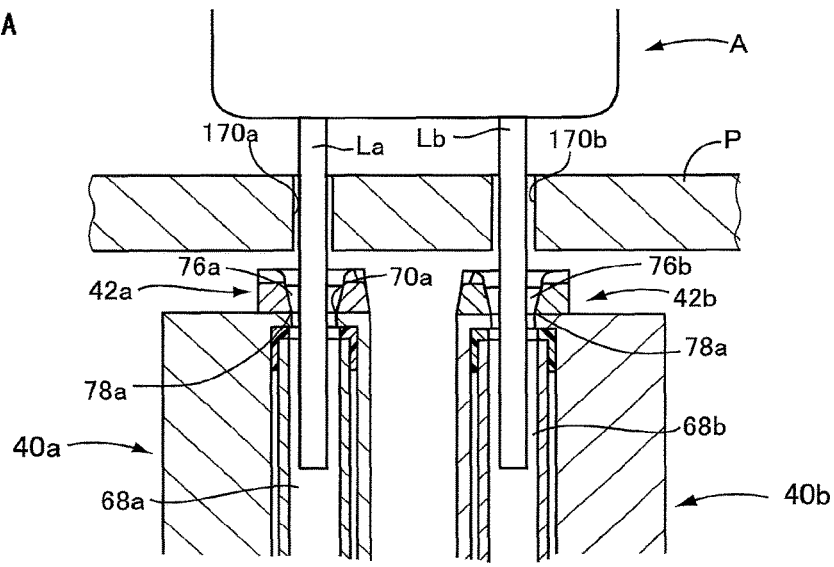
FIG. 8A and FIG. 8B are operation views (a view illustrating a state where lead wires are cut and bent) of the above cut-and-clinch unit.
Figure 8B:
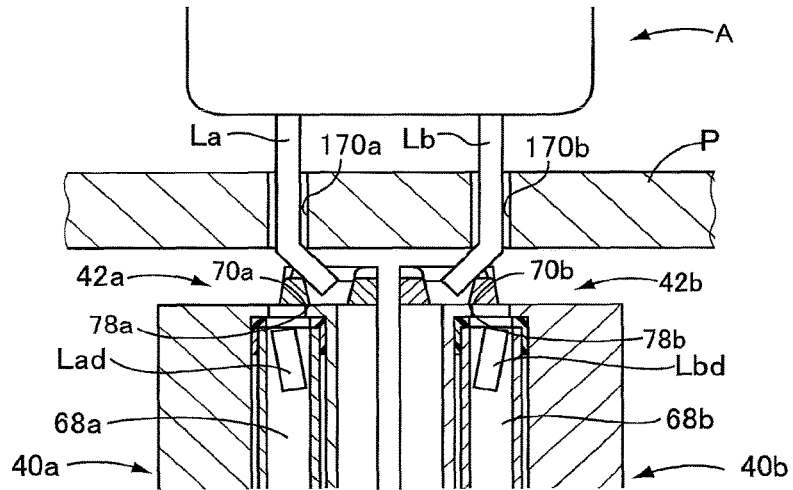

In the present lead component mounting machine, as illustrated in FIG. 8A and FIG. 8B, a lead component A including two lead wires La and Lb is mounted at a predetermined position on the board P conveyed by the board conveyance device 12.

The lead component A supplied by the component supply device 14 is gripped by the work heads 20 and 21 of the component insertion device 16, and is placed on the board P by inserting the lead wires La and Lb through through-holes 170a and 170b that are formed in the board P. Meanwhile, in the cut-and-clinch apparatus 18, the cut-and-clinch unit 34 is moved in the x and y directions, and is rotated around the plumb line so as to reach positions (positions corresponding to the lead wires La and Lb) where the lead wire insertion holes 68a and 68b face the through-holes 170a and 170b. Additionally, the pair of movable elements 80a and 80b are made to approach each other and separate from each other such that the pitch between the pair of lead wire insertion holes 68a and 68b becomes approximately the same as the pitch between the lead wires La and Lb (the pitch between the through-holes 170a and 170b).

The lead wires La and Lb, as illustrated in FIG. 8A, reach the lead wire insertion holes 68a and 68b through the through-holes 170a and 170b of the board P, the lead wire guide holes 76a and 76b. In this state, as illustrated in FIG. 8B, the lead wires La and Lb are cut and bent by the second movable sections 42a and 42b being removed relative to the first movable sections 40a and 40b. Tip parts Lad and Lbd of the cut lead wires are accommodated in a garbage box 172 (refer to FIG. 6) attached to a main body unit 38 through a passage.

However, due to a problem of the machining accuracy of the male screw member 52, an installation error of the guide 48, or the like, the positions of the lead wire insertion holes 68a and 68b may deviate and the lead wires La and Lb of the lead component A may not be favorably inserted into the lead wire insertion holes 68a and 68b via the through-holes 170a and 170b.

Figure 14A:
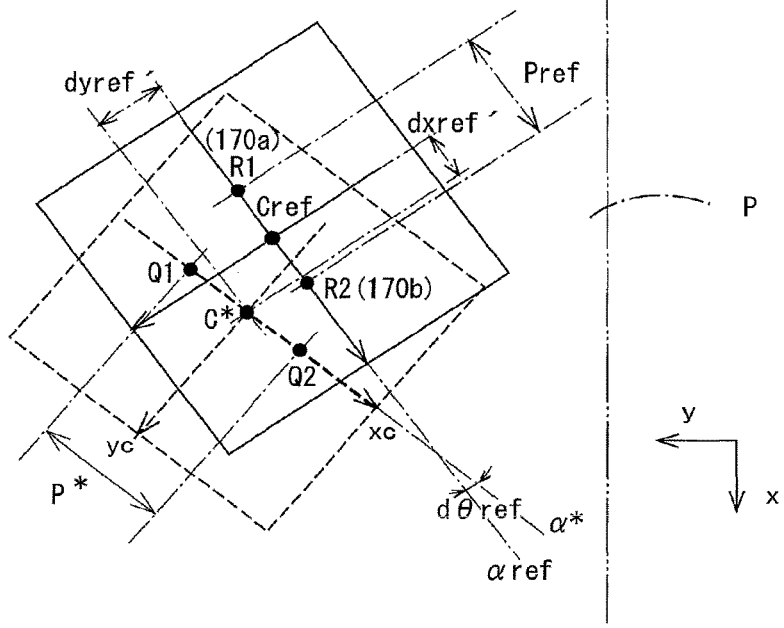
FIG. 14A and FIG. 14B are views illustrating a relationship between an actual position and a target position of the above cut-and-clinch unit.

For example, as illustrated in FIG. 14A, in a case where the lead wires La and Lb of the lead component A are inserted into the through-holes 170a and 170b formed at positions R1 and R2 on the board P, the cut-and-clinch unit 34 is controlled in a posture indicated by a solid line. Specifically, a central point C (refer to FIG. 5, the same as a central point between central points of the lead wire insertion holes 68a and 68b) of the pair of movable elements 80a and 80b is moved in the horizontal direction so as to reach a target central point Cref, and is rotated around the plumb line such that an axis α, which is a straight line which passes through the pair of movable elements 80a and 80b, become parallel to a target axis αref. Additionally, the pitch between the pair of movable elements 80a and 80b is changed so as to become a target pitch Pref. However, practically, the central point may be moved to a position indicated by a dashed line and be located at C*, an actual pitch may become P*, the axis may become α*, the pair of movable elements 80a and 80b may be located at Q1 and Q2 and may deviate from the target positions R1 and 2.

In addition, in a case where the mounting of the lead component A is performed, the target central point Cref, the target axis αref, and the target pitch Pref are determined depending on the mounting position or posture of the lead component A to the board P, the spacing between the lead wires, or the like. However, as will be described below, in a case where the mounting of the lead component A is not performed, and in a case where it is assumed that there are no errors or the like, the target central point Cref, the target axis αref, and the target pitch Pref mean positions and values. For example, in a case where it is assumed that the movable elements 80a and 80b are moved according to control instruction values, the positions of the movable elements 80a and 80b are referred to as target positions, and the position of the central point thereof is referred to as a target central point.

Additionally, hereinafter, the positions of the movable elements 80a and 80b mean the positions of the central points of the lead wire insertion holes 68a and 68b, and the central point of the movable elements 80a and 80b means a central point between the central points of the lead wire insertion holes 68a and 68b.

Moreover, in FIG. 12A to FIG. 12D, FIG. 14A and FIG. 14B, in order to make the disclosure easily understood, deviation is written largely, but actual deviation is slight.

Figures 12A, 12B, 12C, 12D, 13:
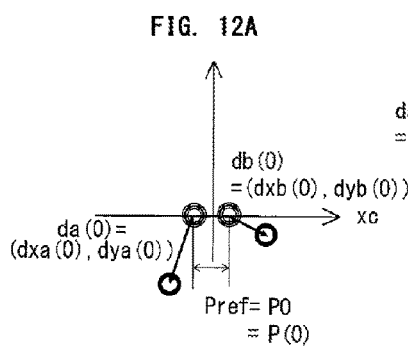
FIG. 12A, FIG. 12B, FIG. 12C, and FIG. 12D are views conceptually illustrating the deviation amounts of actual positions of movable elements, which are acquired by the execution of the above deviation amount acquisition program, from target positions.
FIG. 13 is a view illustrating a relative positional relationship between the coordinate axes of the above lead component mounting machine and the coordinate axes of the cut-and-clinch unit.

Meanwhile, in a case where the x-axis motor 90, the y-axis motor 94, and the θ motor 104 are in a non-operated state and only the P motor 46 is operated, and in a case where it is assumed that there are no errors, the pair of movable elements 80a and 80b should be made to linearly approach each other separate from each other on the xc axis. The central point C should always be at the same point, and the axis a should coincide with the xc axis. However, practically, as illustrated in FIG. 12A to FIG. 12D, respective actual positions (indicated by thick-line circles) of the pair of movable elements 80a and 80b may deviate from target positions (indicated by triple circles). Additionally, with the deviation of the pair of movable elements 80a and 80b, as illustrated in FIG. 12B and FIG. 12D, an actual central point C* of the movable elements 80a and 80b may deviate from the target central point Cref, an actual axis α* may also incline with respect to the xc axis, and an actual pitch P* may also have a magnitude that is different from the target pitch Pref according to a control instruction value of the P motor 46.

In contrast, in a case where the pitch changing device 44 individually has one driving source corresponding to each of the first movable sections 40a and 40b, and in a case where the central point C deviates on the xc axis (on an axis through which the pair of movable elements 80a and 80b pass), it is possible to bring the central point C close to the target central point Cref through the control of the individual driving sources. However, in a case where the number of driving sources is one for the pair of movable elements 40a and 40b, it is difficult to correct the deviation of the central point C through the control of the one driving source (P motor 46). Additionally, in a case where the central point C deviates from the xc axis, it is difficult to correct the deviation of the central point C even if the individual driving sources are included.

Thus, in the present embodiment, in a case where the mounting of the lead components onto the board P is not performed, in other words, in a state where the board P is not conveyed, the actual deviation amounts of the respective positions the movable elements 80a and 80b from the target positions are acquired while changing the target pitch Pref and changing the control instruction value of the P motor 46. Then, (x) a deviation amount (central point deviation amount) of the actual central point C* from the target central point Cref, (y) an angle deviation (axis deviation angle) between the axis α* which actually pass through the movable elements 80a and 80b and the target axis αref, and (z) a deviation amount (pitch deviation amount) between the actual pitch P* and the target pitch Pref of the movable elements 80a and 80b are acquired using the acquired actual deviation amounts of the respective positions of the movable elements 80a and 80b are used, and the relationships between these deviation amounts and the target pitch (or a control instruction value) are stored as a table (hereinafter, a table showing these relationships is referred to as a deviation table). Then, a correction value is acquired on the basis of a deviation amount acquired from the deviation table, and control instruction values for the x-axis motor 90, the y-axis motor 94, the P motor 46, the θ motor 104, and the like are generated on the basis of the correction value. Hereinafter, target pitches that are changed when acquiring the deviation table are referred to as setting pitches. The target pitches are distinguished from target pitches in actual control.

In addition, it is not indispensable to acquire deviation amounts between actual positions and target positions, and only the actual positions of the two movable elements 80a and 80b may be acquired. This is because the target positions are known.

{Acquisition of Deviation Table}

Figure 9:
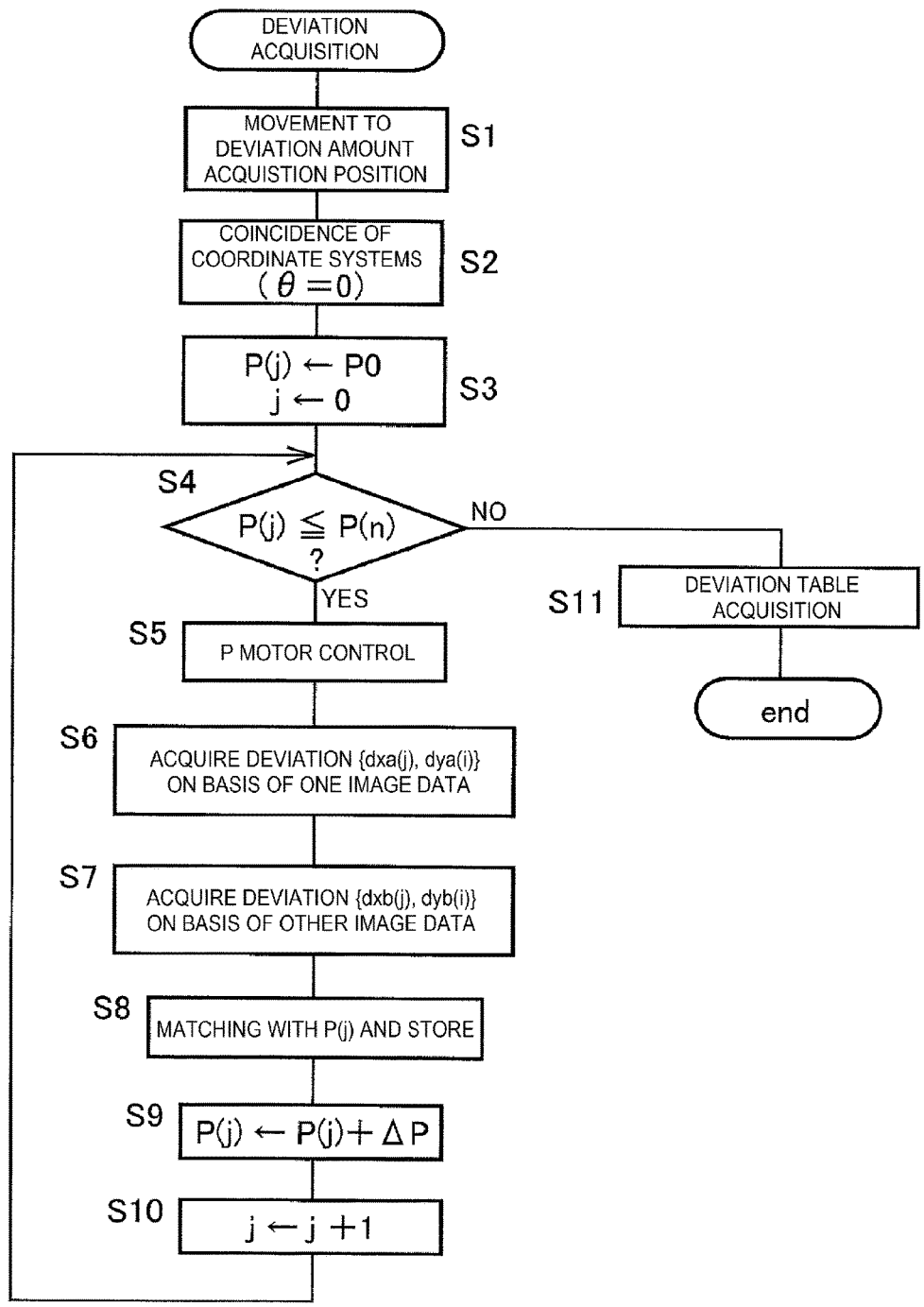
FIG. 9 is a flowchart illustrating a deviation amount acquisition program stored in a memory section of the control device of the above cut-and-clinch apparatus.

Deviation amounts between actual positions and target positions of the movable elements 80a and 80b are acquired by the execution of a deviation acquisition program expressed by a flowchart of FIG. 9, and a deviation table is acquired. In the present program, setting pitches P are stepwisely changed for every ΔP between an initial value P0 and final values P(n).

In Step 1 (hereinafter called S1 for short, the same applies to other Steps) and Step S2, the cut-and-clinch unit 34 is horizontally moved to a predetermined measurement position by the unit moving device 36, and is rotated around the plumb line such that the coordinate system (xc, yc, and zc) of the cut-and-clinch unit 34 coincides with the coordinate system (x, y, and z) of the lead component mounting machine. In S3, a setting pitch P(j) is set to the initial value P0 (j=0). In S4, it is determined whether or not the setting pitches P(j) {=P0+j·ΔP: j=0 to n} are equal to or lower than final values P(n){=P0+n·ΔP}. Since determination is YES in a case where S4 is executed first, in S5, a control instruction value is created according to the setting pitch P0, and the P motor 46 is controlled. In that state, in S6 and S7, image data is obtained by actually imaging the pair of movable elements 80a and 80b, respectively, using the camera 30. Then, on the basis of the obtained image data, deviation amounts of respective actual positions of the movable elements 80a and 80b from target positions are acquired, and in S8, these deviation amounts are matched with the setting pitch P0, and are stored.

In detail, "imaging commands of the movable elements 80a and 80b" are output from the cut-and-clinch control section 148. In the component insertion device 16, the work head 20 is moved at a first position (a position where the mover 80a that is one of the movable elements 80a and 80b can be imaged), and the one mover 80a is actually imaged by the camera 30. Thereafter, the work head 20 is moves to a second position (a position where the other mover 80b can be imaged), and the other movable element 80b is actually imaged. Then, the obtained image data is output from the component insertion control section 146, and is received in the cut-and-clinch control section 148. In the cut-and-clinch control section 148, the positions of the movable elements 80a and 80b on actual (xc, yc) coordinates are acquired, and the deviation amounts of the movable elements from the target positions are acquired. For example, in a case illustrated in FIG. 12A, the deviation amounts {an x component and a y component on the coordinates (xc, yc)} of the actual positions of the movable elements 80a and 80b from the target positions are acquired as shown in the following Expression with respect to the movable elements 80a and 80b, respectively.

$$da(0)=\{dxa(0),dya(0)\}$$

$$db(0)=\{dxb(0),dyb(0)\}$$

Then, the setting pitch is changed by ΔP in S9, j is increased by 1 in S10, and it is determined in S4 whether or not the setting pitch P(1) is equal to or lower than the final value P(n). In this case, since determination is YES, S5 to S10 are repeatedly executed. Hereinafter, while the setting pitches P(j) are equal to or lower than the final values P(n), S5 to S10 are repeatedly executed, and whenever the setting pitches P(j) are changed by every ΔP, the deviation amounts between the target positions and the respective actual positions of the movable elements 80a and 80b are acquired. Meanwhile, if the setting pitches P(j) become greater than the final values P(n), determination of S4 becomes NO, and in S11, a deviation table is created.

In S11, (x) pitch deviation amounts dp(j), (y) axis deviation angles dθ(j), and (z) central point deviation amounts dC(j) are acquired on the basis of the acquired deviation amounts b{da(j), db(j)} of the respective position of the movable elements 80a and 80b, are matched with the setting pitches P(j), and are stored. For example, in a case illustrated in FIG. 12B, a pitch deviation amount dp(k−1), a central point deviation amount dC(k−1)={dx0(k−1), dy0(k−1)}, and an axis deviation angle dC(k−1) are acquired, are matched with a setting pitch P(k−1), and are stored, and in a case illustrated in FIG. 12D, a pitch deviation amount dp(k+1), a central point deviation amount dC(k+1)={dx0(k+1), dy0(k+1)}, and an axis deviation angle dθ(k+1) are acquired, are matched with the setting pitch P(k+1), and are stored.

Figure 11A:
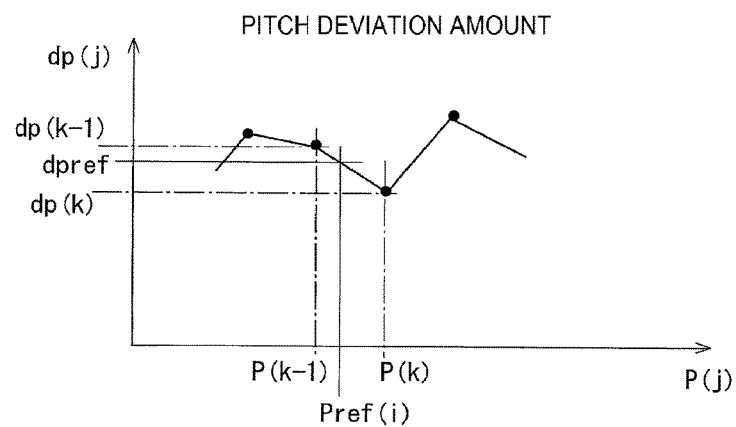
FIG. 11A, FIG. 11B, and FIG. 11C are views illustrating changes in the amount of deviation amount accompanying changes in setting pitches acquired by execution of the above deviation amount acquisition program.
Figure 11B:
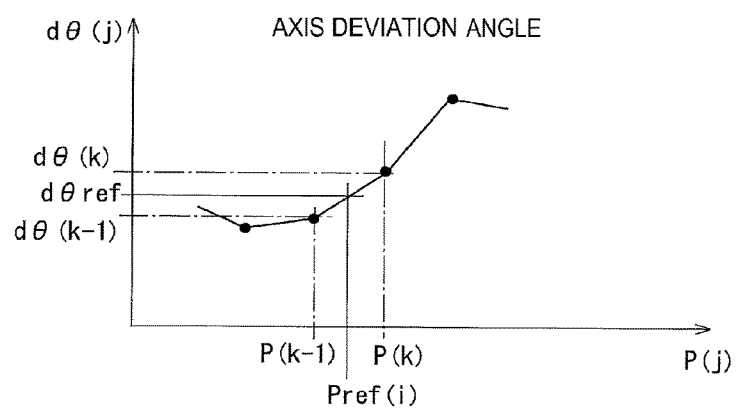
Figure 11C:
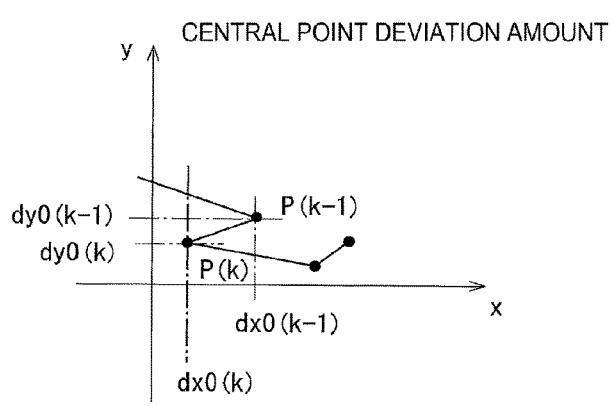

An example of the deviation table that is the relationship between the setting pitches P(j) acquired as described above, and the pitch deviation amounts dp(j), the axis deviation angles M(j), and the central point deviation amounts dC(j) is illustrated in FIG. 11A, FIG. 11B, and FIG. 11C. It is desirable that the deviation table is acquired in advance and is stored in the memory section of the cut-and-clinch control section 148.

In addition, ΔP may be a positive value or may be a negative value, and may be gradually increased or may be gradually decreased.

Additionally, it is not indispensable to create the deviation table in advance and store the deviation table. This is because the pitch deviation amount dp, the axis deviation angle dθ, and the central point deviation amount dC can be acquired each time if the relationship between the setting pitches P(j) and the deviation amounts of the actual positions of the pair of movable elements 80a and 80b from the target positions is known.

{Actual Control Based on Deviation}

Figure 10:
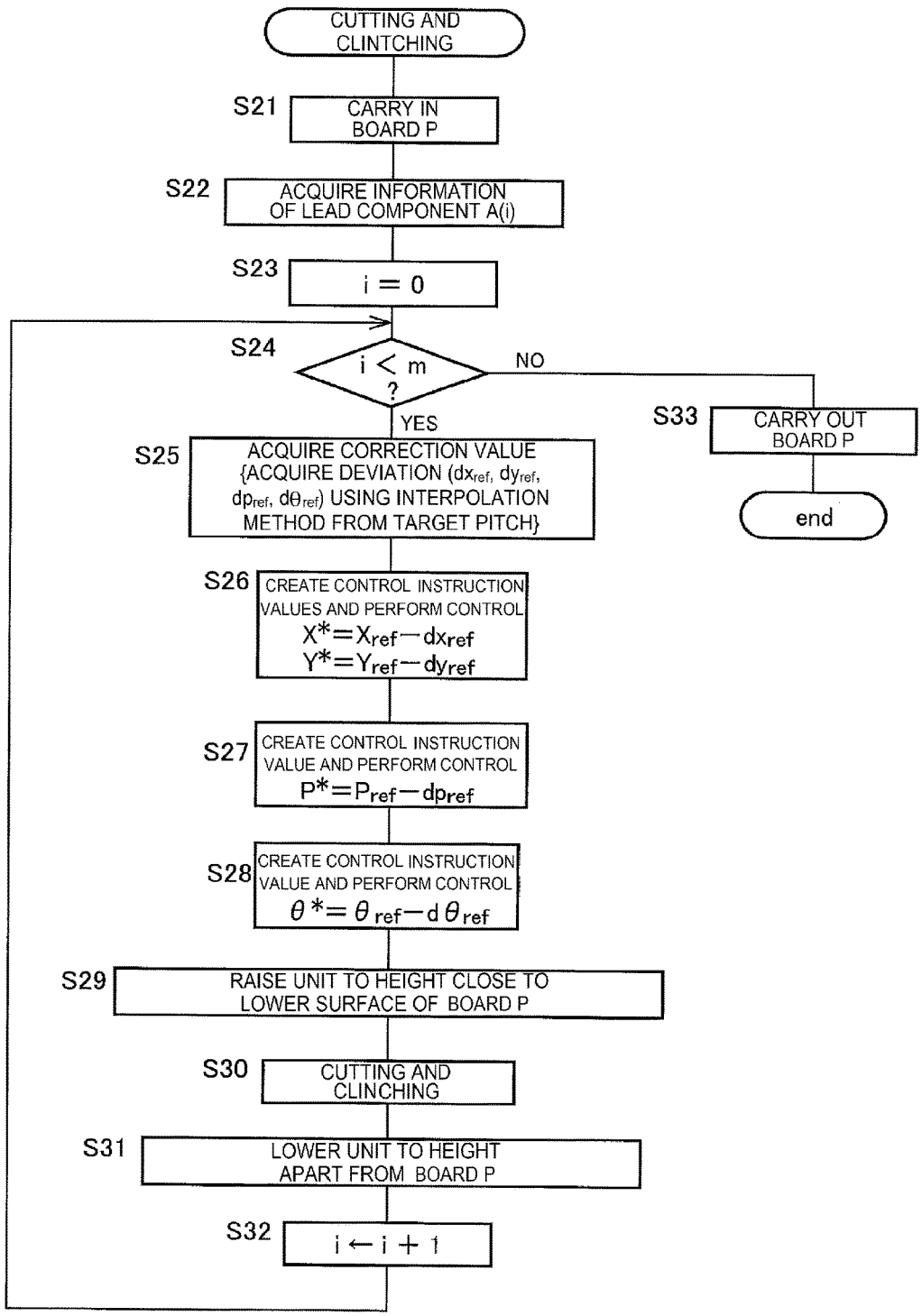
FIG. 10 is a flowchart illustrating a cut-and-clinch program stored in the above memory section.

The lead wires La and Lb of the lead component A are cut and clinched by the execution of the cut-and-clinch program expressed by a flowchart of FIG. 10.

A board P is carried in S21, and information on each of a plurality of (m) lead components A(i) (i=0 to m−1) to be inserted into the board P is acquired in S22. Specifically, regarding the respective lead components A(i), target central points Cref(i){xref(i), yref(i)} determined by positions where the lead components A(i) are mounted on the board, target pitches Pref(i) determined by the pitch between two lead wires La(i) and Lb(i), and target rotational angles θref(i) determined by the posture of the lead components A(i) mounted on the board P are respectively acquired. In S23, the number i of the lead components A(i) is set to 0 (i=0), and information determined by the lead component A(0) is read. In S24, it is determined whether or not the number i of the lead component A is smaller than m. Since determination is YES in a case where S24 is first executed, in S25, a deviation in the case of a target pitch Pref(0) is acquired on the basis of the target pitch Pref(0) and the deviation table, and correction values are obtained regarding the x-axis motor 90, the y-axis motor 94, the P motor 46, and the θ motor 104. Then, in S26 to S28, control instruction values are created on the basis of the correction values, and control is performed accordingly.

In S25, the pitch deviation amount dp, the axis deviation angle dθ, and the central point deviation amount dC in a case where a target pitch is Pref(0) are acquired by an interpolation method on the basis of the deviation table. In addition, here, generally, a case where the target pitches are Pref(i) will be described.

(1) Regarding the target pitches Pref(i), two setting pitches P(k−1) and P(k) that satisfy Expression 1 are acquired on the basis of the deviation table of FIG. 11A.

$$P(k-1)Pref(i)<P(k) \qquad \text{(Expression 1)}$$

(2) Then, from the deviation table of FIG. 11A, FIG. 11B, and FIG. 11C, a pitch deviation amount dp(k−1), an axis deviation angle dθ(k−1), and a central point deviation amount {dx0(k−1), dy0(k−1)} stored in relation to the setting pitch P(k−1), respectively, are acquired and a pitch deviation amount dp(k), an axis deviation angle dθ(k), and a central point deviation amount {dx0(k), dy0(k)} stored in relation to the setting pitch P(k) are acquired.

(3) By the interpolation method, pitch deviation amounts dPref, axis deviation angles dθref, and central point deviation amounts (dxref, dyref) in the case of the target pitches Pref(i) are acquired.

$$dPref=dp(k-1)+\{dp(k)-dp(k-1)\}\cdot\{Pref(i)-P(k-1)\}/\Delta P$$

$$dref=d\theta(k-1)+\{d\theta(k)-d\theta(k-1)\}\cdot\{Pref(i)-P(k-1)\}/\Delta P$$

$$dxref=dx\theta(k-1)+\{dx0(k)-dx0(k-1)\}\cdot\{Pref(i)-P(k-1)\}/\Delta P$$

$$dyref=dy0(k-1)+\{dy0(k)-dy0(k-1)\}\cdot\{Pref(i)-P(k-1)\}/\Delta P$$

(4) Regarding the central point deviation amounts, a relative positional relationship between the coordinate system (x, y) of the unit moving device 36 (lead component mounting machine) and the coordinate system (xc, yc) of the cut-and-clinch unit 34 is further taken into consideration. Although the central point deviation amounts are caused due to errors or the like in the cut-and-clinch unit 34, the deviation amounts are corrected by the control of the unit moving device 36. Therefore, the values of the central point deviation amounts caused in the coordinate system of the cut-and-clinch unit 34 in the coordinate system of the unit moving device 36 (the coordinate system of the lead component mounting machine) are acquired by coordinate conversion. For example, as illustrated in FIG. 13, in a case where the cut-and-clinch unit 34 is rotated by θref(i), a central point deviation amount (dxref', dyref') in the cutand-clinch unit 34 has values shown in Expressions 2 and 3 in the coordinate system of the unit moving device 36 (where β=θref(i)).

$$d x\mathrm{ref} \leftarrow (d x\mathrm{ref} \cdot \cos \beta + d y\mathrm{ref} \cdot \sin \beta) \quad \text{(Expression 2)}$$

$$d y\mathrm{ref} \leftarrow (-d x\mathrm{ref} \cdot \sin \beta + d y\mathrm{ref} \cdot \cos \beta) \quad \text{(Expression 3)}$$

The deviation amount acquired as described above, as illustrated in FIG. 14A and FIG. 14B, is a difference between a position (a position when being moved according to a control instruction value in a case where it is assumed that there is no deviation or the like) indicated by a solid line in the cut-and-clinch unit 34, and a position (actual position) indicated by a dashed line, and corresponds to a correction value of the control instruction value for performing a control such that the cut-and-clinch unit 34 approaches the position indicated by the solid line.

In S26 to 28, control instruction values to the x-axis motor 90, the y-axis motor 94, the θ motor 104, and the P motor 46 are created, and control is performed accordingly. The control instruction value x*, y*, θ*, and P*, as illustrated in Expressions 4 to 7, are values obtained by subtracting the correction values $d x\mathrm{ref}$, $d y\mathrm{ref}$, $d\theta\mathrm{ref}$, and $dP\mathrm{ref}$ from the control instruction values xref, yref, θref, and Pref in a case where it is assumed that there is no deviation.

$$x^* = x\mathrm{ref} - d x\mathrm{ref}$$

$$y^* = y\mathrm{ref} - d y\mathrm{ref}$$

$$\theta^* = \theta\mathrm{ref} - d\theta\mathrm{ref}$$

$$P^* = P\mathrm{ref} - dP\mathrm{ref}$$

Figure 14B:
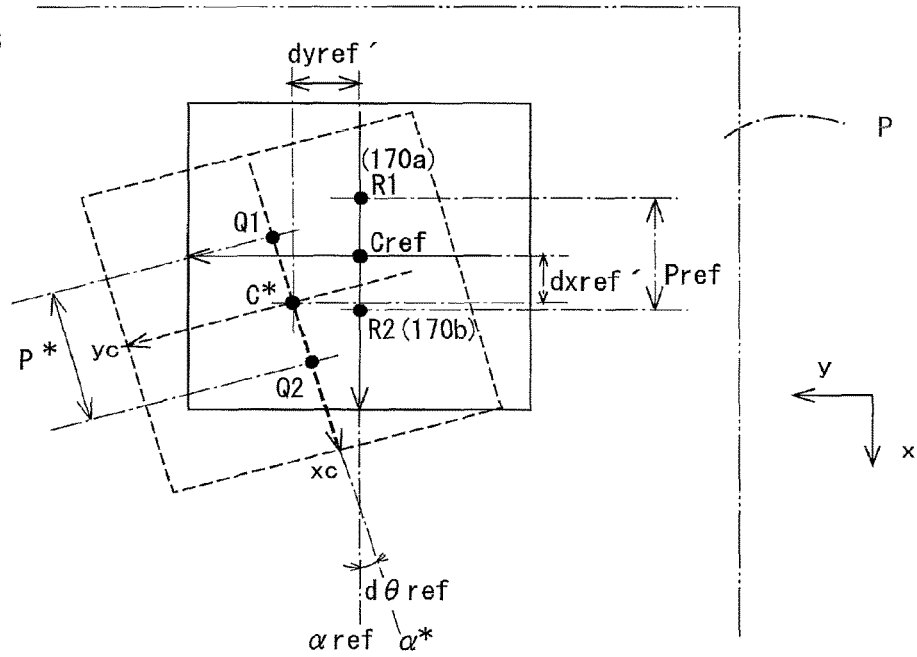

Since θref(i) is 0 in a case illustrated in FIG. 14B, a control instruction value to the θ motor 104 becomes (−$d\theta\mathrm{ref}$), and correction values for the x-axis motor 90 and the y-axis motor 94 become $d x\mathrm{ref}$ (=$d x\mathrm{ref}'$) and $d y\mathrm{ref}$ (=$d y\mathrm{ref}'$).

In addition, in the present embodiment, a target movement amount (rotational amount) is described as a control instruction value. However, in actual control, the amount of supply current determined on the basis of the target movement distance, or the like may be used as the control instruction value.

The cut-and-clinch unit 34 is moved to substantially a target position by the execution of S25 to S28. For example, in the case of FIG. 14A and FIG. 14B, the cut-and-clinch unit is moved to substantially the position indicated by the solid line. In S29, the cut-and-clinch unit 34 is lifted to a height where the openings of the lead wire guide holes 76a and 76b approach the through-holes 170a and 170b of the board P from below. If the lead wires La and Lb of the lead component A are inserted into the lead wire insertion holes 68a and 68b via the through-holes 170a and 170b, in S30, the second movable sections 42a and 42b are moved in the horizontal direction relative to the first movable sections 40a and 40b. Accordingly, the lead wires La and Lb are cut and bent.

Thereafter, in S31, the cut-and-clinch unit 34 is lowered until the cut-and-clinch unit 34 is separated from the board P, and in S32, returns to S24 after the number of lead components A is increased by one. Hereinafter, the plurality of lead components A(i) are inserted, and the lead wires La and Lb are cut and clinched by S24 to S32 being repeatedly executed. Then, after all of in lead components A are mounted, determination of S24 becomes NO, and in S33, the board P is carried out.

In this way, in the present embodiment, the deviation table is created in advance and is stored. Then, in a case where cutting and clinching is actually performed, correction values are created by the interpolation method on the basis of the target pitches Pref(i) and the deviation table, and control instruction values for the x-axis motor 90, the y-axis motor 94, the θ motor 104, and the P motor 46 are created. As a result, it is possible to favorably bring the actual positions of the pair of movable elements 80a and 80b close to target positions, and the positional accuracy of the movable elements 80a and 80b can be improved. As a result, the lead wires La and Lb of the lead component A can be accurately inserted into the lead wire insertion holes 68a and 68b.

Additionally, in a case where the spacing ΔP of the setting pitch of S9 is made small, a more detailed deviation table can be acquired as compared to a case where the spacing is made large. Accurate correction values can be created by creating control instruction values on the basis of the deviation table, and the x-axis motor 90, the y-axis motor 94, the θ motor 104, and the P motor 46 can be accurately controlled. As a result, the positional accuracy of the movable elements 80a and 80b can be further improved.

Moreover, the central point of the pair of second movable sections 42a and 42b can also be made to substantially coincide with the target central point Cref. As a result, it is possible to move the second movable sections 42a and 42b symmetrically to the target central point Cref, and the respective cutting lengths or the bending angles of the two lead wires La and Lb can be made to be the same as each other. As a result, a situation where a load is applied to the board P when one of the two lead wires La and Lb bends insufficiently and the other lead wire bends excessively can be made hard to occur. Additionally, the two lead wires La and Lb can be favorably cut and clinched such that respective bending parts thereof can be bent so as to line up substantially in a straight line.

In the present embodiment, a unit horizontal movement device is constituted of the x-axis moving device 86, the y-axis moving device 87, and the like, and a unit rotation device is constituted of the θ-rotation device 89. Additionally, a movable element position control section is constituted of the deviation amount acquisition program of the cut-and-clinch control section 148 expressed by the flowchart of FIG. 9, portions that store and execute the cut-and-clinch program expressed by the flowchart of FIG. 10, a portion that stores the deviation table conceptually illustrated in FIG. 11A to FIG. 11C, and the like. Additionally, a horizontal movement control section is constituted of a portion of the movable element position control section that stores and executes S25 and S26, and the like, and a rotation control section is constituted of a portion that stores and executes S25 and S28, and the like. Moreover, a central point deviation amount acquisition section and a deviation angle acquisition section are acquired by sections of the movable element position control section that store and execute S25, a section that stores the deviation table, and the like. In addition, a position correcting section is constituted of a section that stores and executes S25, and S26 to S28, and the like. Additionally, an actual position acquisition section is acquired portions of the movable element position control section that stores and executes S1 and S7, and the like, and an actual central point acquisition section is constituted of portions that store and execute S11, and the like.

In addition, it is not indispensable to use the interpolation method, and only the value of P(k) closet to Pref(i) may be used from the deviation table. Additionally, correction values can be acquired on the basis of one or two of pitch deviation amounts, axis deviation angles, and central point deviation amounts. Moreover, depending on the capability of a camera, both the pair of movable elements 80a and 80b may be able to be imaged at once without moving the camera.

Additionally, the disclosure can be widely applied to the position control of a pair of movable elements that can approach each other and separate from each other, as well as the cut-and-clinch unit.

REFERENCE SIGNS LIST

18: cut-and-clinch apparatus, 34: cut-and-clinch unit, 36: unit moving device, 40: first movable section, 42: second movable section, 44: pitch changing device, 68: lead wire insertion hole, 72: movable element, 86: x-axis moving device, 87: y-axis moving device, 88: z-axis moving device, 89: θ-rotation device, 170: through-hole

The invention claimed is:

1. A cut-and-clinch apparatus that cuts and bends protruding parts of two lead wires of a lead component to be respectively inserted through two of a plurality of through-holes formed in a circuit board, the cut-and-clinch apparatus comprising:
  a pair of movable elements that approach and separate from each other and the respective protruding parts of the two lead wires are cut and bent by the pair of movable elements; and
  a movable element position control section that controls the positions of the pair of movable elements on the basis of image data obtained by imaging the pair of movable elements.

2. The cut-and-clinch apparatus according to claim 1, further comprising:
  (a) a cut-and-clinch unit including the pair of movable elements; and
  (b) a unit horizontal movement device that horizontally moves cut-and-clinch unit,
  wherein the movable element position control section includes
  (i) a central point deviation amount acquisition section that acquires a central point deviation amount that is a deviation amount between a target central point and an actual central point of the pair of movable elements acquired on the basis of the image data, and
  (ii) a horizontal movement control section that controls the unit horizontal movement device on the basis of the central point deviation amount acquired by the central point deviation amount acquisition section, to bring the actual central point of the pair of movable elements close to the target central point.

3. The cut-and-clinch apparatus according to claim 1, wherein the pair of movable elements are made to approach each other and separate from each other by one driving source.

4. The cut-and-clinch apparatus according to claim 1, further comprising:
  (a) a cut-and-clinch unit including the pair of movable elements; and
  (b) a unit rotation device that rotates the cut-and-clinch unit around a plumb line,
  wherein the movable element position control section includes
  (i) an axis deviation angle acquisition section that acquires an axis deviation angle that is an angle deviation between a target axis, and an axis that is acquired on the basis of the image data and actually passes through the pair of movable elements, and
  (ii) a rotation control section that controls the unit rotation device on the basis of the axis deviation angle acquired by the axis deviation angle acquisition section to bring the axis that actually passes through the pair of movable elements close to a posture parallel to the target axis.

5. The cut-and-clinch apparatus according to claim 1, wherein the movable element position control section includes
  (i) an actual position acquisition section that acquires respective actual positions of the pair of movable elements on the basis of the image data, and
  (ii) a position correcting section that corrects the positions of the pair of movable elements on the basis of one or more of (x) a central point deviation amount that is a deviation amount between a target central point and an actual central point of the pair of movable element, (y) an axis deviation angle that is an angle deviation between a target axis and an axis that actually passes through the pair of movable elements, and (z) a pitch deviation amount that is a deviation amount between a target pitch and an actual pitch of the pair of movable elements, the central point deviation amount, the axis deviation angle, and the pitch deviation amount being acquired on the basis of the respective actual positions of the pair of movable elements acquired by the actual position acquisition section.

6. A board work machine including a pair of movable elements that are made to approach each other and separate from each other on the same straight line by one driving source, the board work machine comprising:
  an imaging device that images each of the pair of movable elements;
  an actual central point acquisition section that acquires an actual central point of the pair of movable elements on the basis of image data of the pair of movable elements imaged by the imaging device; and
  a movable element position control section that controls the positions of the pair of movable elements, on the basis of a central point deviation amount that is a deviation amount of the actual central point, which is acquired by the actual central point acquisition section, from the target central point.

* * * * *